(12) United States Patent
Kawashima et al.

(10) Patent No.: US 10,777,149 B2
(45) Date of Patent: Sep. 15, 2020

(54) DRIVING CIRCUIT (71) Applicant: WUHAN CHINA STAR OPTOELECTRONICS SEMICONDUCTOR DISPLAY TECHNOLOGY CO., LTD., Wuhan, Hubei (CN)

(72) Inventors: Shingo Kawashima, Hubei (CN); Guang Li, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 28 days.

(21) Appl. No.: 16/094,477

(22) PCT Filed: Aug. 2, 2018

(86) PCT No.: PCT/CN2018/098215
§ 371 (c)(1),
(2) Date: Oct. 18, 2018

(87) PCT Pub. No.: WO2019/214093
PCT Pub. Date: Nov. 14, 2019

(65) Prior Publication Data
US 2019/0348004 A1 Nov. 14, 2019

(51) Int. Cl.
*G09G 3/36* (2006.01)

(52) U.S. Cl.
CPC ............ *G09G 3/36* (2013.01); *G09G 2310/06* (2013.01); *G09G 2310/08* (2013.01)

(58) Field of Classification Search
CPC ... G09G 3/36; G09G 2310/06; G09G 2310/08
USPC ........................................................ 345/208
See application file for complete search history.

(56) References Cited

U.S. PATENT DOCUMENTS

| 2015/0348646 A1 | 12/2015 | Wang et al. | |
| 2016/0071614 A1 | 3/2016 | Lee | |
| 2016/0329015 A1* | 11/2016 | Ji | G09G 3/32 |
| 2018/0218686 A1 | 8/2018 | Li | |
| 2019/0051263 A1 | 2/2019 | Wang et al. | |
| 2019/0333596 A1* | 10/2019 | Zhu | G11C 19/28 |

FOREIGN PATENT DOCUMENTS

| CN | 101364446 A | 2/2009 |
| CN | 102831861 A | 12/2012 |
| CN | 104008779 A | 8/2014 |
| CN | 104347039 A | 2/2015 |
| CN | 106782374 A | 5/2017 |
| CN | 107316619 A | 11/2017 |

* cited by examiner

*Primary Examiner* — Chanh D Nguyen
*Assistant Examiner* — Ngan T. Pham-Lu
(74) *Attorney, Agent, or Firm* — Mark M. Friedman (57) ABSTRACT

The present disclosure provides a driving circuit and a liquid crystal display panel, including an input module, a first control module, a second control module, a third control module, an output module and a reset module, which can simplify structure of the driving circuit while ensuring the liquid crystal display panel works well.

13 Claims, 4 Drawing Sheets

DRIVING CIRCUIT

CROSS REFERENCE TO RELATED APPLICATION

This application claims the priority of International Application No. PCT/CN2018/098215, filed on 2018 Aug. 2, which claims priority to Chinese Application No. 201810443743.4, filed on 2018 May 10. The entire disclosures of each of the above applications are incorporated herein by reference.

BACKGROUND OF THE DISCLOSURE

1. Field of Disclosure

The present disclosure relates to display technology, and particularly relates to a driving circuit.

2. Description of Related Art

With development of electronic technology, driving circuits of liquid crystal display (LCD) panels are more and more widely used in display devices, making reliability improvement of output signals provided by the driving circuit become more and more important. However, driving circuit structure of existing LCD panels is relatively complex.

SUMMARY

The present disclosure provides a driving circuit, which can simplify structure of the driving circuit under the premise that a liquid crystal display panel works well.

In a first aspect of the present disclosure, a driving circuit is provided, comprising:

an input module connected to a cascaded signal input terminal, a first clock signal terminal, a low level terminal, a first node and a third node, configured to make a voltage of the first node be same as a voltage of the low level terminal, and make a voltage of the third node be same as a voltage of the cascaded signal input terminal according to a first clock signal at the first clock signal terminal;

a first control module connected to the third node, a fourth node and a second clock signal terminal, configured to make a voltage of the fourth node be same as a voltage of the second clock signal terminal according to the voltage of the third node;

a second control module connected to the fourth node, the first node and a high level terminal, configured to make the voltage of the first node be same as a voltage of the high level terminal according to the voltage of the fourth node;

a third control module connected to the low level terminal, the third node and a second node, making a voltage of the second node be same as the voltage of the third node according to the voltage of the low level terminal;

an output module connected to the second node, the second clock signal terminal and an output signal terminal, configured to output a second clock signal at the second clock signal terminal via the output signal terminal according to the voltage of the second node;

a reset module connected to the first node, the high level terminal and the output signal terminal, configured to make a voltage of the output signal terminal be same as the voltage of the high level terminal according to the voltage of the first node;

wherein the input module comprises:

a first transistor comprising a first terminal connected to the low level terminal, a second terminal connected to the first node, and a gate connected to the first clock signal terminal;

a second transistor comprising a first terminal connected to the cascaded signal input terminal, a second terminal connected to the first node, and a gate connected to the first clock signal terminal;

wherein the first control module comprises a third transistor that comprises a first terminal connected to the second clock signal terminal, a second terminal connected to the fourth node, and a gate connected to the third node.

According to an embodiment in conjunction to the first aspect of the present disclosure, the second control module comprises:

a fourth transistor comprising a first terminal connected to the high level terminal, a second terminal connected to the first node, and a gate connected to the fourth node;

a first capacitor comprising a first electrode connected to the high level terminal, and a second electrode connected to the fourth node.

According to another embodiment in conjunction to the first aspect of the present disclosure or any one of the above embodiments, the first capacitor is a variable capacitor.

According to another embodiment in conjunction to the first aspect of the present disclosure or any one of the above embodiments, the third control module comprises:

a fifth transistor comprising a first terminal connected to the third node, a second terminal connected to the second node, and a gate connected to the low level terminal.

According to another embodiment in conjunction to the first aspect of the present disclosure or any one of the above embodiments, the output module comprises:

a sixth transistor comprising a first terminal connected to the second clock signal terminal, a second terminal connected to the output signal terminal, and a gate connected to the second node;

a third capacitor comprising a first electrode connected to the second node, a second electrode connected to the output signal terminal.

According to another embodiment in conjunction to the first aspect of the present disclosure or any one of the above embodiments, the reset module comprises:

a seventh transistor comprising a first terminal connected to the high level terminal, a second terminal connected to the output signal terminal, and a gate connected to the first node;

a second capacitor comprising a first electrode connected to the high level terminal, and a second electrode of the second capacitor connects the first node.

In a second aspect of the present disclosure, a driving circuit is provided, comprising:

an input module connected to a cascaded signal input terminal, a first clock signal terminal, a low level terminal, a first node and a third node, configured to make a voltage of the first node be same as a voltage of the low level terminal, and make a voltage of the third node be same as a voltage of the cascaded signal input terminal according to a first clock signal at the first clock signal terminal;

a first control module connected to the third node, a fourth node and a second clock signal terminal, configured to make a voltage of the fourth node be same as a voltage of the second clock signal terminal according to the voltage of the third node;

a second control module connected to the fourth node, the first node and a high level terminal, configured to make the voltage of the first node be same as a voltage of the high level terminal according to the voltage of the fourth node;

a third control module connected to the low level terminal, the third node and a second node, making a voltage of the second node be same as the voltage of the third node according to the voltage of the low level terminal;

an output module connected to the second node, the second clock signal terminal and an output signal terminal, configured to output a second clock signal at the second clock signal terminal via the output signal terminal according to the voltage of the second node;

a reset module connected to the first node, the high level terminal and the output signal terminal, configured to make a voltage of the output signal terminal be same as the voltage of the high level terminal according to the voltage of the first node.

According to another embodiment in conjunction to the second aspect of the present disclosure, the input module comprises:

a first transistor comprising a first terminal connected to the low level terminal, a second terminal connected to the first node, and a gate connected to the first clock signal terminal;

a second transistor comprising a first terminal connected to the cascaded signal input terminal, a second terminal connected to the first node, and a gate connected to the first clock signal terminal.

According to another embodiment in conjunction to the second aspect of the present disclosure or any one of the above embodiments, the first control module comprises:

a third transistor comprising a first terminal connected to the second clock signal terminal, a second terminal connected to the fourth node, and a gate connected to the third node.

According to another embodiment in conjunction to the second aspect of the present disclosure or any one of the above embodiments, the second control module comprises:

a fourth transistor comprising a first terminal connected to the high level terminal, a second terminal connected to the first node, and a gate of the fourth transistor connected to the fourth node;

a first capacitor comprising a first electrode connected to the high level terminal, and a second electrode connected to the fourth node.

According to another embodiment in conjunction to the second aspect of the present disclosure or any one of the above embodiments, the first capacitor is a variable capacitor.

According to another embodiment in conjunction to the second aspect of the present disclosure or any one of the above embodiments, the third control module comprises:

a fifth transistor comprising a first terminal connected to the third node, a second terminal connected to the second node, and a gate connected to the low level terminal.

According to another embodiment in conjunction to the second aspect of the present disclosure or any one of the above embodiments, the output module comprises:

a sixth transistor comprising a first terminal connected to the second clock signal terminal, a second terminal connected to the output signal terminal, and a gate connected to the second node;

a third capacitor comprising a first electrode connected to the second node, and a second electrode connected to the output signal terminal.

According to another embodiment in conjunction to the second aspect of the present disclosure or any one of the above embodiments, the reset module comprises:

a seventh transistor comprising a first terminal connected to the high level terminal, a second terminal connected to the output signal terminal, and a gate connected to the first node;

a second capacitor comprising a first electrode connected to the high level terminal, and a second electrode connected to the first node.

According to another embodiment in conjunction to the second aspect of the present disclosure or any one of the above embodiments, each of the transistors is a p-channel metal oxide semiconductor (PMOS) tube.

In a third aspect of the present disclosure, a driving circuit is provided, comprising:

a first transistor comprising a first terminal connected to the low level terminal, a second terminal connected to the first node, and a gate connected to the first clock signal terminal;

a second transistor comprising a first terminal connected to the cascaded signal input terminal, a second terminal connected to the first node, and a gate connected to the first clock signal terminal;

a third transistor comprising a first terminal connected to the second clock signal terminal, a second terminal connected to the fourth node, and a gate connected to the third node;

a fourth transistor comprising a first terminal connected to the high level terminal, a second terminal connected to the first node, and a gate connected to the fourth node;

a first capacitor comprising a first electrode connected to the high level terminal, and a second electrode connected to the fourth node;

a fifth transistor comprising a first terminal connected to the third node, a second terminal connected to the second node, and a gate connected to the low level terminal;

a sixth transistor comprising a first terminal connected to the second clock signal terminal, a second terminal connected to the output signal terminal, and a gate of the sixth transistor connects the second node;

a third capacitor comprising a first electrode connected to the second node, and a second electrode connected to the output signal terminal;

a seventh transistor comprising a first terminal connected to the high level terminal, a second terminal connected to the output signal terminal, and a gate connected to the first node;

a second capacitor comprising a first electrode connected to the high level terminal, and a second electrode connected to the first node.

In the embodiments of the present disclosure, a driving circuit comprising an input module, a first control module, a second control module, a third control module, an output module and a reset module, can simplify structure of a liquid crystal display panel under the premise that the liquid crystal display panel works well.

BRIEF DESCRIPTION OF DRAWINGS

In order to more clearly illustrate the embodiments of the present disclosure or related art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF EMBODIMENTS

Embodiments of the present disclosure are described in detail with the technical matters, structural features, achieved objects, and effects with reference to the accompanying drawings as follows. Specifically, the terminologies in the embodiments of the present disclosure are merely for describing the purpose of the certain embodiment, but not to limit the invention.

Transistors used in all the embodiments of the present disclosure can be thin film transistors, or field-effect tubes, or other devices with similar characteristics. The transistors are mainly switch transistors according to their role in circuits. Since a source electrode and drain electrode of switch transistors used here are symmetrical, the source electrode and drain electrode can be exchanged with each other. In the embodiments of the present disclosure, the source electrode is described as a first terminal and the drain electrode is described as a second terminal in order to distinguish between two terminals of the transistor except a gate. According to the structure in attached figures, the transistors comprise a middle terminal used as the gate, an input signal terminal used as the source, and an output signal terminal used as the drain. In addition, the switch transistors used in the embodiments of the present disclosure are turned-on when the gate is at high level, and are turned-off when the gate is at low level.

It needs to be explained that the words like "first" and "second" are only used to make a distinction from same or similar items that have basically same functions, and not used to limit quantity and order of execution.

Figure 1:
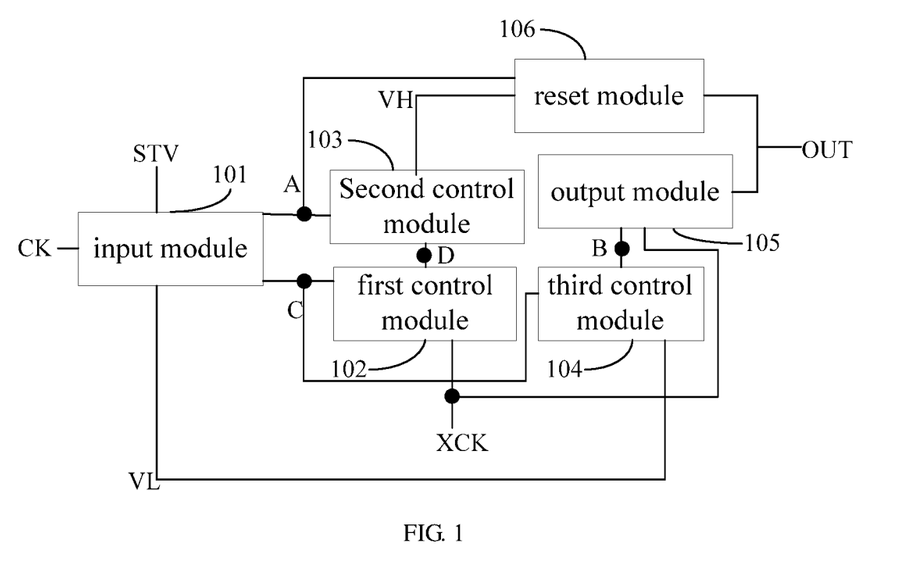
FIG. 1 is a structure diagram of a driving circuit.

FIG. 1 is a structure diagram of a driving circuit in an embodiment of the present disclosure. As shown in FIG. 1, a driving circuit that is provided comprises an input module 101, a first control module 102, a second control module 103, a third control module 104, an output module 105 and a reset module 106.

The input module 101 connects a cascaded signal input terminal STV, a first clock signal terminal CK, a low level terminal VL, a first node A and a third node C, configured to make a voltage of the first node A be same as a voltage of the low level terminal VL, and make a voltage of the third node C be same as a voltage of the cascaded signal input terminal STV according to a first clock signal at the first clock signal terminal CK.

The first control module 102 connects the third node C, a fourth node D and a second clock signal terminal XCK, configured to make a voltage of the fourth node D be same as a voltage of the second clock signal terminal XCK according to the voltage of the third node C.

The second control module 103 connects the fourth node D, the first node A and a high level terminal VH, configured to make the voltage of the first node A be same as a voltage of the high level terminal VH according to the voltage of the fourth node D.

The third control module 104 connects the low level terminal VL, the third node C and a second node B, configured to make a voltage of the second node B be same as the voltage of the third node C according to the voltage of the low level terminal VL.

The output module 105 connects the second node B, the second clock signal terminal XCK and an output signal terminal OUT, configured to output a second clock signal at the second clock signal terminal XCK via the output signal terminal OUT according to the voltage of the second node B.

The reset module 106 connects the first node A, the high level terminal VH and the output signal terminal OUT, configured to make a voltage of the output signal terminal OUT be same as the voltage of the high level terminal VH according to the voltage of the first node A.

It needs to be explained that a plurality of modules share a same signal terminal (for example, the first control module 102 and output module 105 share the second clock signal terminal XCK) which can reduce the number of signal terminals in the liquid crystal display panel in above embodiment. Of course, these modules can also connect different signal terminals, as long as the different signal terminals can provide a similar signal.

Figure 2:
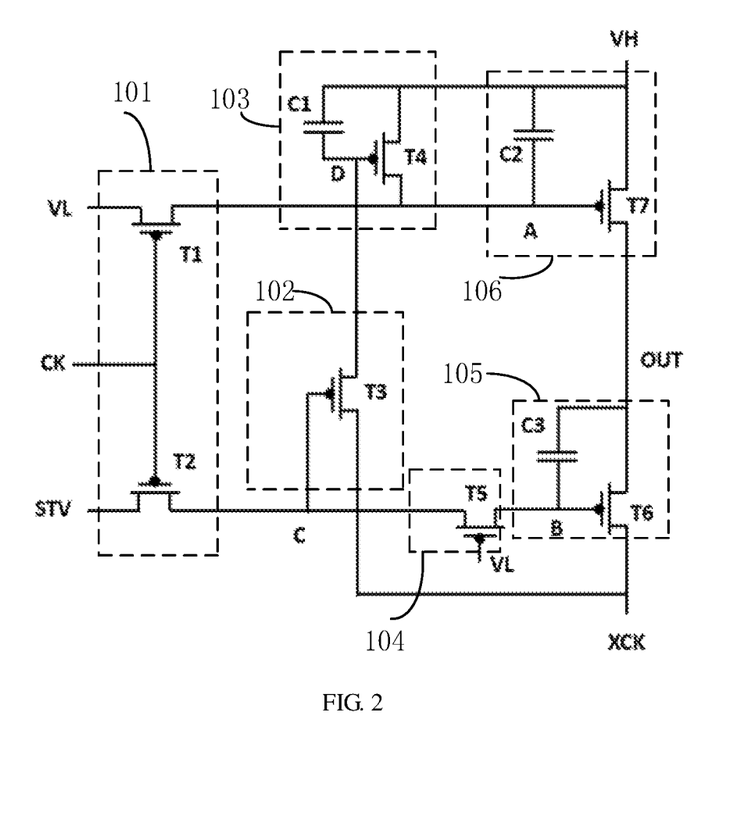
FIG. 2 is a circuit diagram of a driving circuit.

FIG. 2 is a circuit diagram of a driving circuit in an embodiment of the present disclosure. Specifically, the input module 101 comprises a first transistor T1 and a second transistor T2. The first transistor T1 comprises a first terminal connected to the low level terminal VL, a second terminal connected to the first node A, and a gate connected to the first clock signal terminal CK. The second transistor T2 comprises a first terminal connected to the cascaded signal input terminal STV, a second terminal connected to the first node A, and a gate connected to the first clock signal terminal CK.

The first control module 102 comprises a third transistor T3. The third transistor T3 comprises a first terminal connected to the second clock signal terminal XCK, a second terminal connected to the fourth node D, and a gate connected to the third node C.

The second control module 103 comprises a fourth transistor T4 and a first capacitor C1. The fourth transistor T4 comprises a first terminal connected to the high level terminal VH, a second terminal connected to the first node A, and a gate connected to the fourth node D. The first capacitor C1 comprises a first electrode connected to the high level terminal VH, and a second electrode connected to the fourth node D, wherein the first capacitor C1 is a variable capacitor.

The third control module 104 comprises a fifth transistor T5 that comprises a first terminal connected to the third node C, a second terminal connected to the second node B, and a gate connected to the low level terminal VL.

The output module 105 comprises a sixth transistor T6 and a third capacitor C3. The sixth transistor T6 comprises a first terminal connected to the second clock signal terminal XCK, a second terminal connected to the output signal terminal OUT, and a gate connected to the second node B. The third capacitor C3 comprises a first electrode connected to the second node B, a second electrode connected to the output signal terminal OUT.

The reset module 106 comprises a seventh transistor T7 and a second capacitor C2. The seventh transistor T7, comprising a first terminal connected to the high level terminal VH, a second terminal connected to the output signal terminal OUT, and a gate connected to the first node A. The second capacitor C2, comprising a first electrode connected to the high level terminal VH, and a second electrode of the second capacitor C2 connects the first node A.

Furthermore, each of the transistors in the embodiments of the present disclosure is a p-channel metal oxide semiconductor (PMOS) tube, which is that the first transistor T1, the second transistor T2, the third transistor T3, the fourth transistor T4, the fifth transistor T5, the sixth transistor T6, and the seventh transistor T7 are all PMOS transistors. The PMOS tube is turned-on when the gate is at high level, and is turned-off when the gate is at low level.

Figure 3:
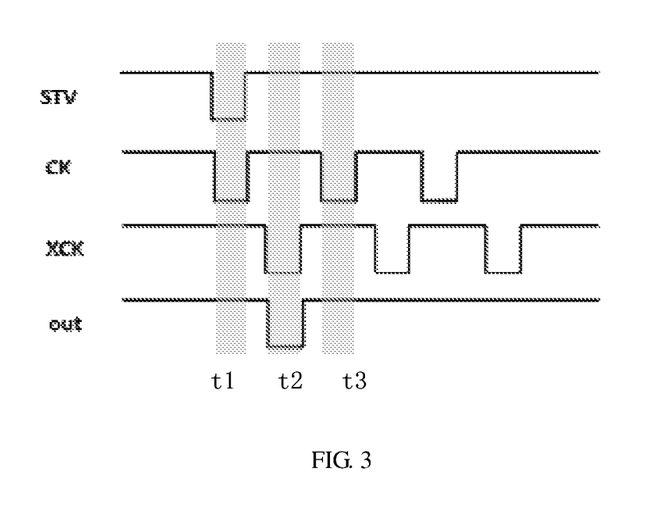
FIG. 3 is a driving sequence diagram of a driving circuit.

FIG. 3 is a driving sequence diagram of a driving circuit in an embodiment of the present disclosure. As shown in FIG. 3, a driving sequence of the driving circuit that is provided comprises a first time period t1, a second time period t2 and a third time period t3.

Specifically, during the first time period t1, a cascaded signal at the cascaded signal input terminal STV is at low level. The first clock signal at the first clock signal terminal CK is at low level. The second clock signal at the second clock signal is at high level. The first transistor T1 and the second transistor T2 are connected with each other. The low level of a low level terminal VL is transmitted to the first node A via the first transistor T1, configured to make the voltage of the first node A be same as the voltage of the low level terminal VL. At the same time, the low level of the cascaded signal at the cascaded signal input terminal STV is transmitted to the third node C via the second transistor T2, configured to make the voltage of the third node C be same as the voltage of the cascaded signal input terminal STV. In addition, the fifth transistor T5 is turned-on according to the low level of the low level terminal VL, configured to make the voltage of the second node B be same as the voltage of the third node C.

During the second time period t2, the cascaded signal at the cascaded signal input terminal STV is at high level. The first clock signal at the first clock signal terminal CK is at high level. The second clock signal at the second clock signal is at low level. In addition, the fifth transistor T5 is turned-on according to the low level of the low level terminal VL, configured to make the voltage of the second node B be same as the voltage of the third node C. At the same time, the voltage of the second node B and the voltage of the third node C are kept at low level. Since the gate of the sixth transistor T6 connects the second node B, the sixth transistor T6 is turned-on, and the low level of the second clock signal at the second clock signal terminal XCK is transmitted to the output signal terminal OUT via the sixth transistor T6.

At this time, since the gate of the third transistor T3 connects to the third node C, the third transistor T3 is turned-on. The second clock signal at the second clock signal terminal XCK is transmitted to the fourth node D via the third transistor T3, configured to make the fourth transistor T4 be turned-on. The high level of the high level terminal VH is transmitted to the first node A via the fourth transistor T4, configured to make the seventh transistor T7 be turned-off.

During the third time period t3, the cascaded signal at the cascaded signal input terminal STV is at high level. The first clock signal at the first clock signal terminal CK is at low level. The second clock signal at the second clock signal terminal XCK is at high level. The first transistor T1 is turned-on, and the low level of the low level terminal VL is transmitted to the first node A via the first transistor T1, configured to make the seventh transistor T7 be turned-on, and the high level of the high level terminal VH is transmitted to the output signal terminal OUT via the seventh transistor T7.

At the same time, the high level of the cascaded signal at the cascaded signal input terminal STV is transmitted to the third node C via the second transistor T2. In addition, since the fifth transistor T5 is turned-off according to the low level of the low level terminal VL, the third node C and the second node B are connected with each other, and the sixth transistor T6 is turned-off.

The driving circuit provided in the embodiment of the present disclosure can simplify the driving circuit structure while ensuring the liquid crystal display panel works well.

Figure 4:
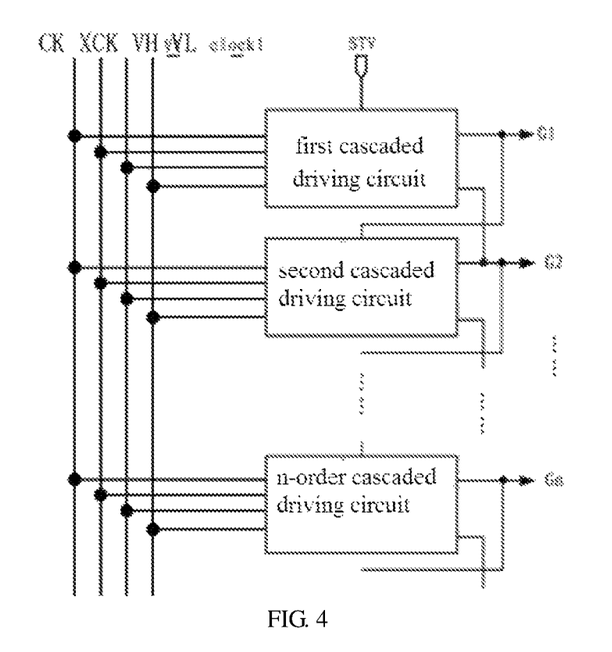
FIG. 4 is a structure diagram of a liquid crystal display panel.

FIG. 4 is a structure diagram of a liquid crystal display panel. As shown in FIG. 4, the liquid crystal display panel comprises at least two cascaded driving circuits.

A cascaded signal input terminal of a first cascaded driving circuit connects a frame beginning signal terminal. An output signal terminal of the first cascaded driving circuit connects a cascaded signal input terminal of a second cascaded driving circuit. A cascaded signal input terminal of a n-order cascaded driving circuit connects an output signal terminal of a (n−1)-order cascaded driving circuit. An output signal terminal of the n-order cascaded driving circuit connects a cascaded signal input terminal of a (n+1)-order cascaded driving circuit, wherein the n is a positive integer.

Specifically, the liquid crystal display panel comprises several cascaded driving circuits, wherein the cascaded signal input terminal of the first cascaded driving circuit connects the frame beginning signal terminal, and the output signal terminal of the first cascaded driving circuit connects the cascaded signal input terminal of the second cascaded driving circuit and a gate line G1; the cascaded signal input terminal of the second cascaded driving circuit connects the output signal terminal of the first cascaded driving circuit, and an output signal terminal of the second cascaded driving circuit connects a cascaded signal input terminal of a third driving circuit and a gate line G2. According to the connection method of the second driving circuit, other driving circuits in the liquid crystal display panel are connected.

Each of the driving circuits has a first clock signal terminal CK, a second clock signal terminal XCK, a high level terminal VH and a low level terminal VL.

The driving circuit provided in the embodiment of the present disclosure can simplify structure of the driving circuit while ensuring the liquid crystal display panel works well.

In conclusion, the present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. A driving circuit, comprising:
   an input module connected to a cascaded signal input terminal, a first clock signal terminal, a low level terminal, a first node and a third node, configured to make a voltage of the first node be same as a voltage of the low level terminal, and make a voltage of the third node be same as a voltage of the cascaded signal input terminal according to a first clock signal at the first clock signal terminal;
   a first control module connected to the third node, a fourth node and a second clock signal terminal, configured to make a voltage of the fourth node be same as a voltage of the second clock signal terminal according to the voltage of the third node;
   a second control module connected to the fourth node, the first node and a high level terminal, configured to make the voltage of the first node be same as a voltage of the high level terminal according to the voltage of the fourth node;

a third control module connected to the low level terminal, the third node and a second node, making a voltage of the second node be same as the voltage of the third node according to the voltage of the low level terminal;
an output module connected to the second node, the second clock signal terminal and an output signal terminal, configured to output a second clock signal at the second clock signal terminal via the output signal terminal according to the voltage of the second node;
a reset module connected to the first node, the high level terminal and the output signal terminal, configured to make a voltage of the output signal terminal be same as the voltage of the high level terminal according to the voltage of the first node;
wherein the input module comprises:
a first transistor comprising a first terminal connected to the low level terminal, a second terminal connected to the first node, and a gate connected to the first clock signal terminal;
a second transistor comprising a first terminal connected to the cascaded signal input terminal, a second terminal connected to the third node, and a gate connected to the first clock signal terminal;
wherein the first control module comprises a third transistor that comprises a first terminal connected to the second clock signal terminal, a second terminal connected to the fourth node, and a gate connected to the third node;
wherein the second control module comprises:
a fourth transistor comprising a first terminal connected to the high level terminal, a second terminal connected to the first node, and a gate connected to the fourth node;
a first capacitor comprising a first electrode connected to the high level terminal, and a second electrode connected to the fourth node.

2. The driving circuit of claim 1, wherein the first capacitor is a variable capacitor.

3. The driving circuit of claim 1, wherein the third control module comprises:
a fifth transistor comprising a first terminal connected to the third node, a second terminal connected to the second node, and a gate connected to the low level terminal.

4. The driving circuit of claim 1, wherein the output module comprises:
a sixth transistor comprising a first terminal connected to the second clock signal terminal, a second terminal connected to the output signal terminal, and a gate connected to the second node;
a third capacitor comprising a first electrode connected to the second node, a second electrode connected to the output signal terminal.

5. The driving circuit of claim 1, wherein the reset module comprises:
a seventh transistor comprising a first terminal connected to the high level terminal, a second terminal connected to the output signal terminal, and a gate connected to the first node;
a second capacitor comprising a first electrode connected to the high level terminal, and a second electrode of the second capacitor connects the first node.

6. A driving circuit, comprising:
an input module connected to a cascaded signal input terminal, a first clock signal terminal, a low level terminal, a first node and a third node, configured to make a voltage of the first node be same as a voltage of the low level terminal, and make a voltage of the third node be same as a voltage of the cascaded signal input terminal according to a first clock signal at the first clock signal terminal;
a first control module connected to the third node, a fourth node and a second clock signal terminal, configured to make a voltage of the fourth node be same as a voltage of the second clock signal terminal according to the voltage of the third node;
a second control module connected to the fourth node, the first node and a high level terminal, configured to make the voltage of the first node be same as a voltage of the high level terminal according to the voltage of the fourth node;
a third control module connected to the low level terminal, the third node and a second node, making a voltage of the second node be same as the voltage of the third node according to the voltage of the low level terminal;
an output module connected to the second node, the second clock signal terminal and an output signal terminal, configured to output a second clock signal at the second clock signal terminal via the output signal terminal according to the voltage of the second node;
a reset module connected to the first node, the high level terminal and the output signal terminal, configured to make a voltage of the output signal terminal be same as the voltage of the high level terminal according to the voltage of the first node;
wherein the second control module comprises:
a fourth transistor comprising a first terminal connected to the high level terminal, a second terminal connected to the first node, and a gate of the fourth transistor connected to the fourth node;
a first capacitor comprising a first electrode connected to the high level terminal, and a second electrode connected to the fourth node.

7. The driving circuit of claim 6, wherein the input module comprises:
a first transistor comprising a first terminal connected to the low level terminal, a second terminal connected to the first node, and a gate connected to the first clock signal terminal;
a second transistor comprising a first terminal connected to the cascaded signal input terminal, a second terminal connected to the third node, and a gate connected to the first clock signal terminal.

8. The driving circuit of claim 6, wherein the first control module comprises:
a third transistor comprising a first terminal connected to the second clock signal terminal, a second terminal connected to the fourth node, and a gate connected to the third node.

9. The driving circuit of claim 6, wherein the first capacitor is a variable capacitor.

10. The driving circuit of claim 6, wherein the third control module comprises:
a fifth transistor comprising a first terminal connected to the third node, a second terminal connected to the second node, and a gate connected to the low level terminal.

11. The driving circuit of claim 6, wherein the output module comprises:
a sixth transistor comprising a first terminal connected to the second clock signal terminal, a second terminal connected to the output signal terminal, and a gate connected to the second node;

a third capacitor comprising a first electrode connected to the second node, and a second electrode connected to the output signal terminal.

12. The driving circuit of claim 6, wherein the reset module comprises:
a seventh transistor comprising a first terminal connected to the high level terminal, a second terminal connected to the output signal terminal, and a gate connected to the first node;
a second capacitor comprising a first electrode connected to the high level terminal, and a second electrode connected to the first node.

13. A driving circuit, comprising:
a first transistor comprising a first terminal connected to the low level terminal, a second terminal connected to the first node, and a gate connected to the first clock signal terminal;
a second transistor comprising a first terminal connected to the cascaded signal input terminal, a second terminal connected to the third node, and a gate connected to the first clock signal terminal;
a third transistor comprising a first terminal connected to the second clock signal terminal, a second terminal connected to the fourth node, and a gate connected to the third node;
a fourth transistor comprising a first terminal connected to the high level terminal, a second terminal connected to the first node, and a gate connected to the fourth node;
a first capacitor comprising a first electrode connected to the high level terminal, and a second electrode connected to the fourth node;
a fifth transistor comprising a first terminal connected to the third node, a second terminal connected to the second node, and a gate connected to the low level terminal;
a sixth transistor comprising a first terminal connected to the second clock signal terminal, a second terminal connected to the output signal terminal, and a gate of the sixth transistor connects the second node;
a third capacitor comprising a first electrode connected to the second node, and a second electrode connected to the output signal terminal;
a seventh transistor comprising a first terminal connected to the high level terminal, a second terminal connected to the output signal terminal, and a gate connected to the first node;
a second capacitor comprising a first electrode connected to the high level terminal, and a second electrode connected to the first node.

* * * * *

UNITED STATES PATENT AND TRADEMARK OFFICE
CERTIFICATE OF CORRECTION

PATENT NO. : 10,777,149 B2
APPLICATION NO. : 16/094477
DATED : September 15, 2020
INVENTOR(S) : Shingo Kawashima and Guang Li It is certified that error appears in the above-identified patent and that said Letters Patent is hereby corrected as shown below:

On the Title Page

(30) Foreign Application Priority Data:
Change: (Absent information)
To "May 10, 2018 (CN) 201810443743.4"

Signed and Sealed this
Fifteenth Day of December, 2020

Andrei Iancu
*Director of the United States Patent and Trademark Office*